United States Patent [19]

Fang et al.

[11] Patent Number: 5,457,336
[45] Date of Patent: Oct. 10, 1995

[54] NON-VOLATILE MEMORY STRUCTURE INCLUDING PROTECTION AND STRUCTURE FOR MAINTAINING THRESHOLD STABILITY

[75] Inventors: Hao Fang, Cupertino; Sameer Haddad, San Jose; Chi Chang, Redwood City, all of Calif.

[73] Assignee: Advanced Micro Devices, Inc., Sunnyvale, Calif.

[21] Appl. No.: 322,811

[22] Filed: Oct. 13, 1994

[51] Int. Cl.$^6$ .................................................. H01L 27/02
[52] U.S. Cl. ........................ 257/322; 257/356; 257/360; 257/529
[58] Field of Search ..................... 257/529, 356, 257/316, 321, 322; 365/185

[56] References Cited

U.S. PATENT DOCUMENTS 5,315,145  5/1994  Lukaszek .................................. 257/321

Primary Examiner—Robert P. Limanek
Attorney, Agent, or Firm—Benman Collins & Sawyer

[57] ABSTRACT

An improved nonvolatile memory device is provided, in which the threshold voltage variations ($V_{ts}$) and transconductance degradation are significantly reduced. The NVM includes protection structure for limiting the process induced damage incurred during the manufacturing process. The protection structure is utilized to provide reliable and stable dielectrical characteristics for the NVM device. The protection structure is easy to implement and will not affect the conventional NVM performance.

23 Claims, 12 Drawing Sheets

| Name | Test Structure | Antenna Ratio |
|---|---|---|
| FL | standard flash device | 2300 |
| FM | standard flash device | 2000 |
| FS | standard flash device | 50 |
| FP | flash with P+-diode connected to the gate | 50 |
| FN | flash with P+-diode connected to the gate | 50 |
| PL | standard Poly-1 transistor | 2300 |
| PM | standard Poly-1 transistor | 2000 |
| PS | standard Poly-1 transistor | 50 |

NON-VOLATILE MEMORY STRUCTURE INCLUDING PROTECTION AND STRUCTURE FOR MAINTAINING THRESHOLD STABILITY

FIELD OF THE INVENTION

The present invention relates to an improved non-volatile memory (NVM) device, and more particularly to an NVM device which allows for a stable threshold voltage ($V_{ts}$) and allows for a high transconductance and improved reliability.

BACKGROUND OF THE INVENTION

Nonvolatile memories (NVMs) are utilized in integrated circuits to provide storage of data when power is removed from the integrated circuit. It has been found that in NVMs, the threshold voltage ($V_{ts}$) can vary over a wide range due to in-line process related stress and damage. It has also been found that the threshold voltage of one type of NVM known as a FLASH cell, in a mini array test structure is approximately 0.3 to 0.8 volts lower than the actual threshold voltage of the product cell. It has also been found that the threshold voltage for the reference cell can also be 0.3 to 0.8 volts below the threshold voltage ($V_{ts}$) of the product. This difference causes the $V_{ts}$ of that given NVM device in the integrated circuit to be about a few tenths volt lower than the expected specification.

Accordingly, this $V_{ts}$ variation in reference cell of NVM product can create large column leakage currents that can cause a integrated circuit to function in an improper manner. In addition, it has also been found that this $V_{ts}$ variation is not uniform from NVM to NVM in the manufacturing process. This variation therefore causes product reliability issues in the NVMs. The $V_{ts}$ variation therefore requires that more complex synching and verifying circuitry be utilized with the NVM. The complex circuitry significantly increases the cost of the non-volatile memory. The $V_{ts}$ variation also causes extensive product testing and analysis, significantly increases the cost of manufacturing and oftentimes limits the fabrication flexibility of the particular circuit. Finally, this problem causes problems with the process control, as well as significantly decreasing product yield. When the process induced damage is large, the transconductance of the NVM can be seriously degraded and hence the device performance can be severely affected.

What is needed therefore is a protection structure for non-volatile memory and the like that solves the threshold voltage instability problem. This system should be easy to implement, should improve product reliability, should significantly improve the performance of the non-volatile memory. The present invention addresses such a need.

SUMMARY OF THE INVENTION

It has been discovered that the $V_{ts}$ instability is due to plasma induced charging damage on the dielectric layers of a nonvolatile memory device.

Accordingly, in a first aspect, a non-volatile memory (NVM) comprises a metal layer, a first polysilicon (p) layer coupled to the metal layer, and a dielectric layer coupled to the first p layer.

The NVM further includes a second p-layer coupled to the dielectric layer, a tunnel oxide region coupled to the second p-layer, a source region coupled to the tunnel oxide region, and a drain region coupled to the tunnel oxide region. The NVM in accordance with the present invention further includes protection means coupled to the metal layer for preventing plasma induced damage to the dielectric layer.

In another aspect, the protection means comprises a polysilicon or metal fuse coupled between the metal layer and a p-substrate.

In yet another aspect, the protection means comprises a diode coupled to the metal layer.

In yet another aspect, the protection means comprises a transistor coupled to the metal layer.

In a final aspect of the present invention, the protection means comprises a first diode coupled to the metal layer, a P well coupled to the first diode, a second diode coupled to the metal layer, and a N well coupled to the second transistor.

The protection means in accordance with the present invention is utilized advantageously to prevent a process-induced charge build up and hence the stress voltage on the dielectric layers of the NVM and thereby provides for $V_{ts}$ stability, high $G_m$ and better reliability.

BRIEF DESCRIPTION OF THE DRAWINGS

FIG. 1a is a table showing antenna ratios for typically NVM devices.

DETAILED DESCRIPTION OF THE DRAWINGS

The present invention relates to an improvement in non-volatile memory NVM structures which provides for the NVM reliability. The following description is presented to enable one of ordinary skill in the art to make an use the invention as provided in the context of a particular application and its requirements. Various modifications to the preferred embodiments will be readily apparent to those skilled in the art, and the generic principles defined here may be applied to other embodiments. Thus, the present invention is not intended to be limited to the embodiments shown, but is to be accorded the widest scope consistent with the principles and novel features disclosed herein.

Figure 1:
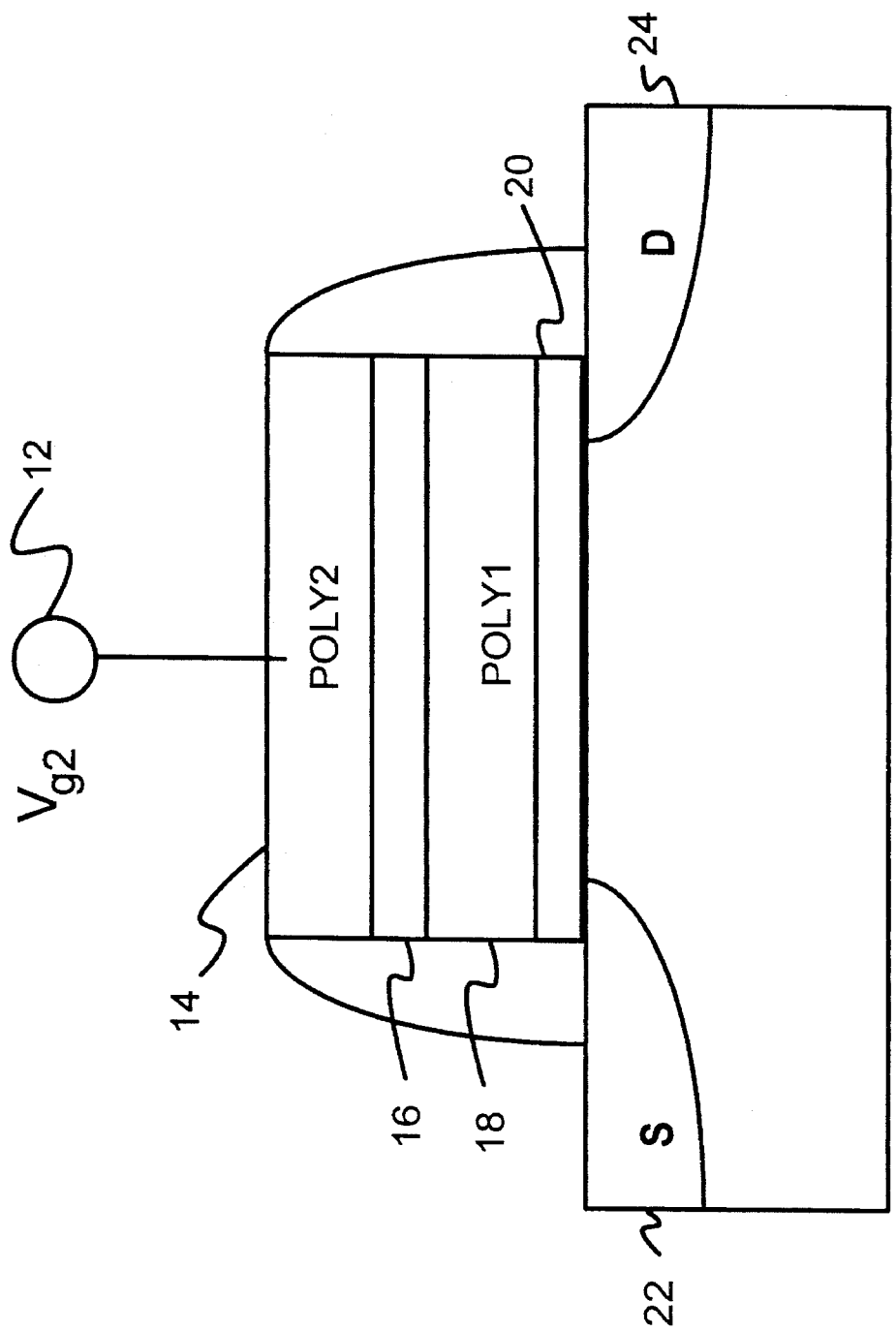
FIG. 1 shows a block diagram of conventional FLASH and poly-1 transistor devices.

Referring now to FIG. 1, what is shown is a block diagram of a nonvolatile memory cell (NVM) 10. The NVM 10 includes a metal layer ($V_{g2}$) 12, and a first polysilicon (p) layer 14 coupled to the metal layer 12. A dielectric layer 16 is coupled to the first p-layer 14. The dielectric layer 16 in this embodiment as shown in the cutaway view is an oxide/nitride/oxide (ONO) layer. A second p-layer 18 is coupled to the ONO layer 16. A tunnel oxide region 20 is coupled to the second p-layer 18. Source and drain regions 22 and 24 are coupled to the tunnel oxide region 20.

Typically the first p-layer is between 1500 Å–5000 Å thick. The dielectric layer is between 80 Å to 500 Å. The second p-layer is typically between 1000 Å–3000 Å. Finally, the tunnel oxide is typically less than 150 Å.

Figure 2:
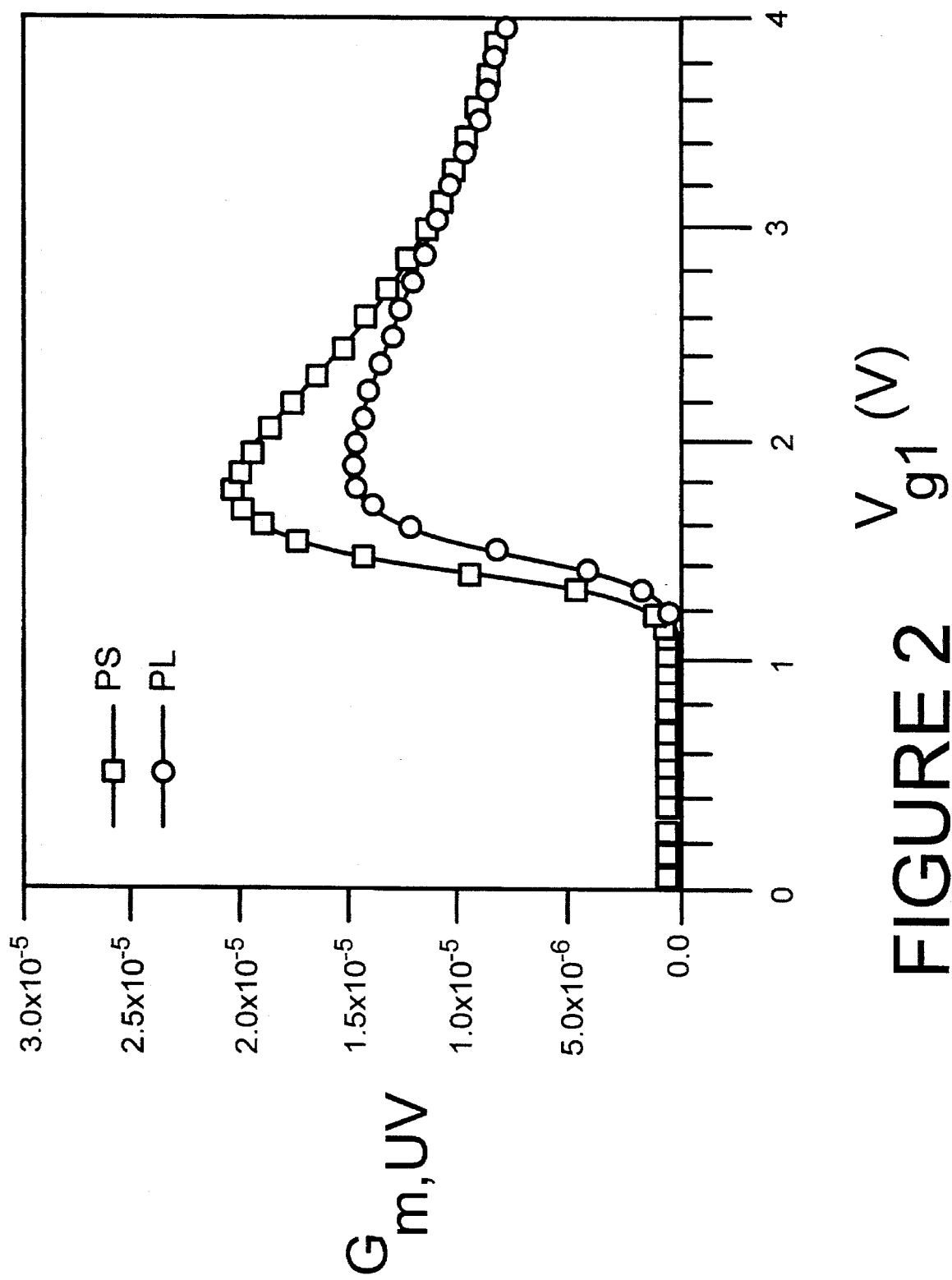
FIGS. 2–4 are charts that show the transconductance ($G_m$) degradation and $V_{ts}$ variation for the various poly-1 transistor and FLASH NVMs of Table 1.
Figure 3:
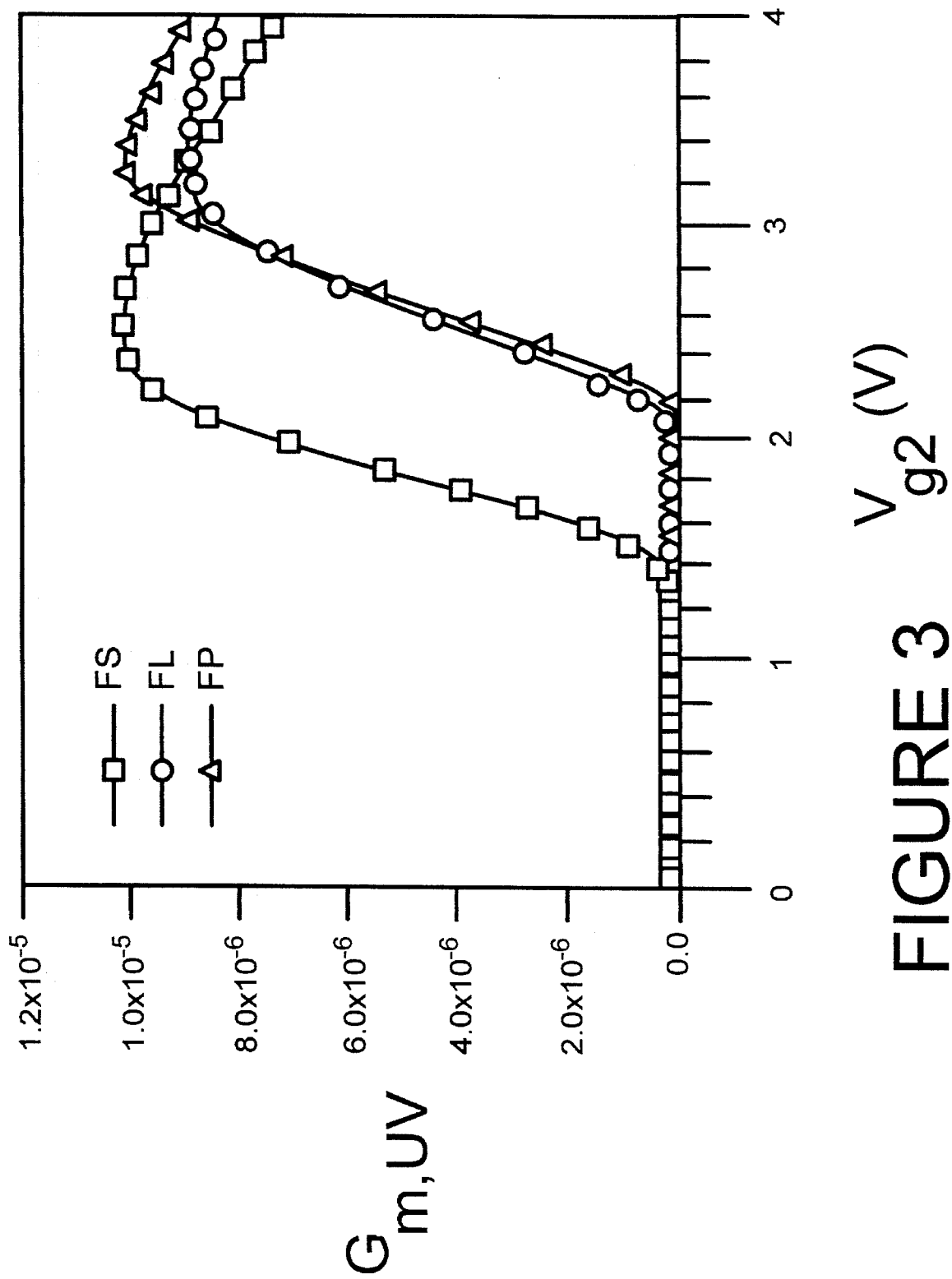

Plasma-induced oxide damage is a critical issue in CMOS device scaling and reliability. It has been determined that plasma induced damage to the ONO dielectric layer 16 is the principal reason for the instability of the threshold voltage ($V_{ts}$). FIG. 1a shows a table of FLASH and POLY NVMs with different antenna ratios. FIGS. 2 and 3 are charts that show the transconductance ($G_m$) degradation for the various poly-1 transistors and FLASH NVMs of FIG. 1a.

Figure 4:
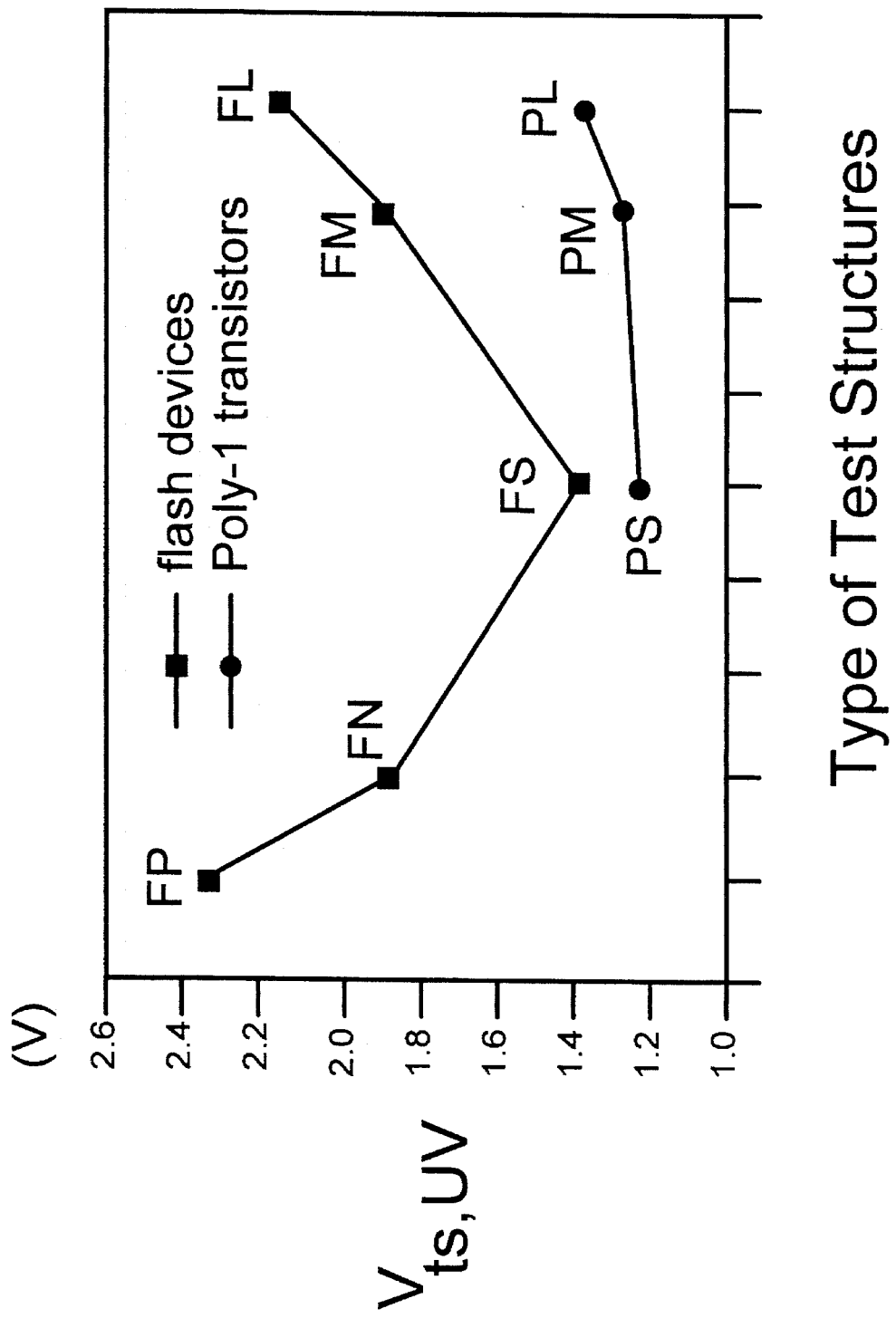

Referring now to FIGS. 2 and 3, significant transconductance ($G_m$) degradation has been observed on devices with high antenna ratios. In addition, referring now to FIG. 4, UV-erased threshold voltage ($V_{ts,uv}$) increased with increasing antenna ratio for both poly-1 transistors and FLASH NVM devices. The pronounced difference in shifts of $V_{ts,uv}$ between FLASH and Poly-1 devices is a result of the charge trapping in the ONO dielectric layer 20 (FIG. 1). Accordingly, it has been determined that a build-up of charges on the gate (polysilicon 14) during plasma processing is the reason for the $V_{ts}$ instability. These charges induce electric fields across the ONO dielectric layer 16 and the tunnel oxide region 20 which are inversely proportional to the ONO dielectric thickness (layer 16) and tunnel oxide thickness (region 20), respectively. As the NVM device is scaled or shrinked, this problem becomes more acute.

Moreover, it has been found that there are enhanced electron trapping in the larger antenna ratio capacitor. It has also been found that the level of plasma damage in the ONO dielectric layer and tunnel oxide layer is proportional to the antenna ratio. (These results are consistent with the plasma stress data shown in FIGS. 3 and 4).

Figure 5:
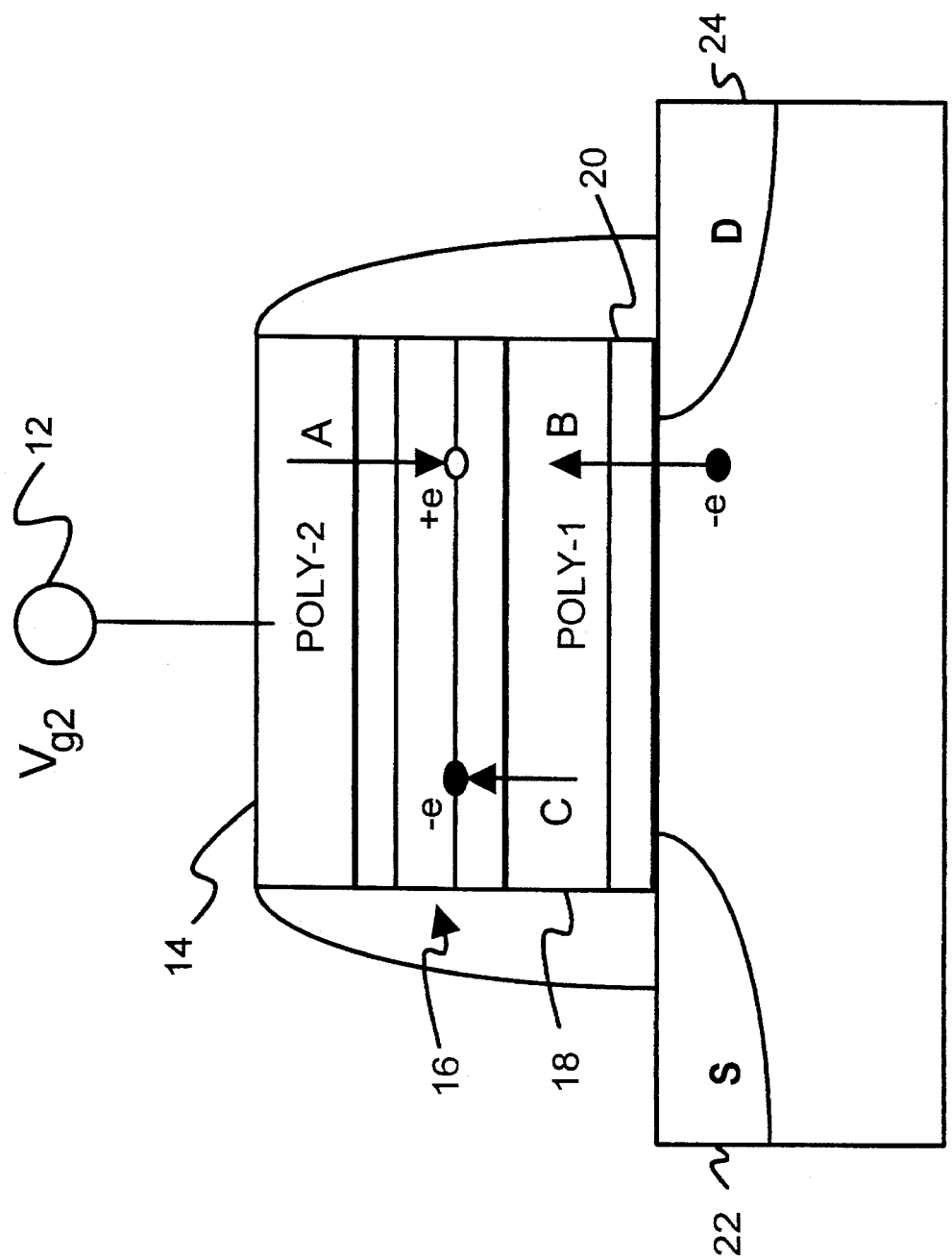
FIG. 5 is a diagram of a physical model for plasma-induced ONO charging.

A physical model for plasma-induced ONO charging has been proposed as shown in FIG. 5. At low field plasma stressing, hole-dominated Frankel-Poole conduction (process A) results in the initial positive charge trapping in the ONO film and hence the $V_{ts,uv}$ reduction. At high field stressing, electrons will tunnel into the Poly-1 gate (process-B), and then the ONO dielectric (process C). Tunnel oxide damage during process B and electron trapping at the bottom $SiO_2/SiN_x$ interface in process C lead to the observed $G_m$ degradation and $V_{ts,uv}$ increase. Therefore, all the $V_{ts,uv}$ and $G_m$ dependencies on different structures can be interpreted with this model.

Therefore the plasma-induced ONO charging and tunnel oxide damage were responsible mechanisms for $V_{ts,uv}$ instability and $G_m$ degradation in non-volatile memories. The degree of plasma damage in the ONO dielectric and tunnel oxide increased with increasing device antenna ratio. The present invention is directed toward providing protection structures to limit the plasma induced charging and stress damage to the dielectric layer 16 and the tunnel oxide 20, and to eliminate $V_{ts,uv}$ stability and $G_m$ degradation in NVMs.

To more particularly, describe the advantages of the present invention refer now to FIGS. 6–11 in conjunction with the following discussion.

FIGS. 6–11, show schematic diagrams of various protection structures for NVMs that would limit process induced damage on protected NVMs and would therefore provide a more stable $V_{ts}$ than in known NVMs.

Figure 6:
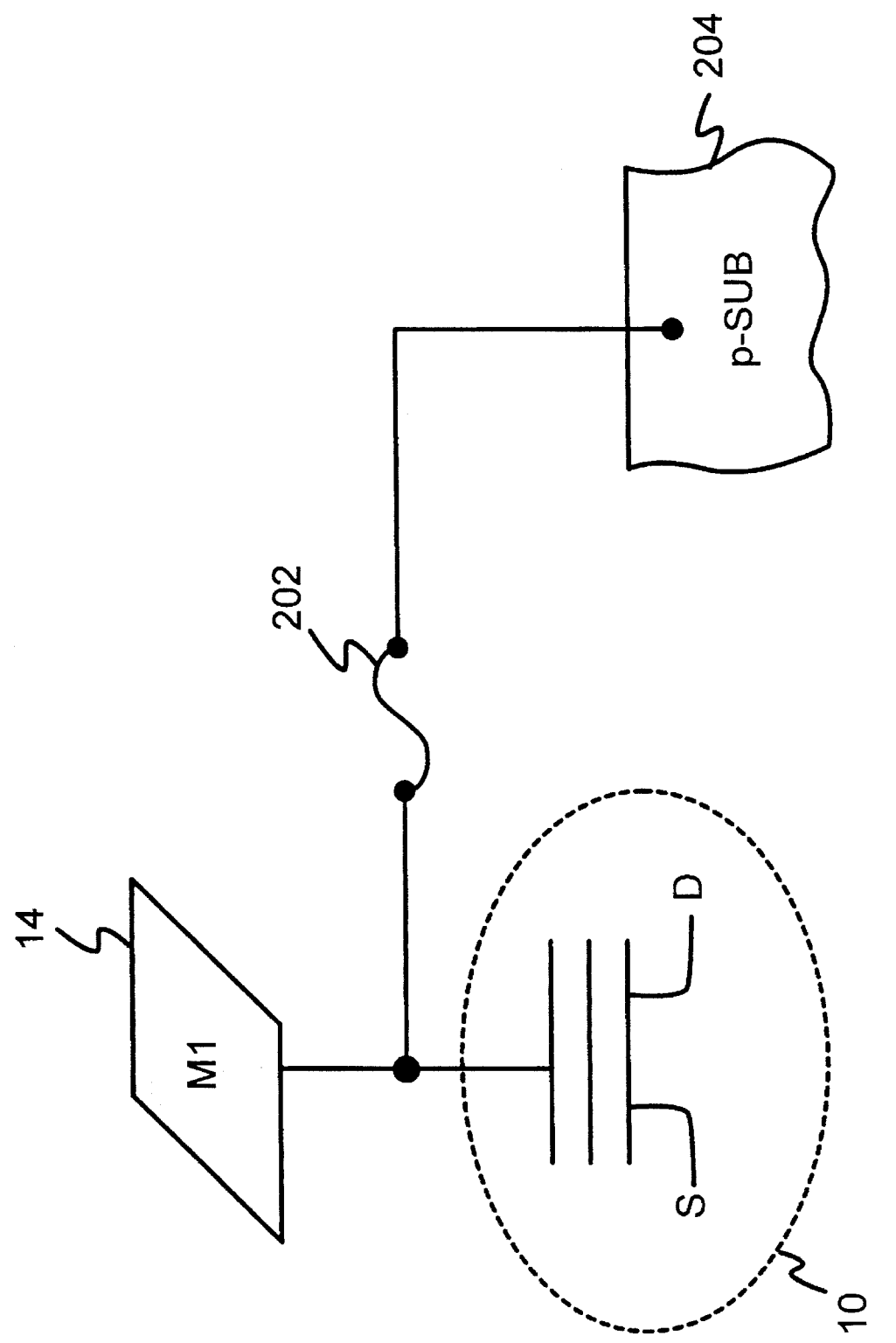
FIG. 6 is a first protection structure for preventing process induced damage in accordance with the present invention.

FIG. 6 shows a first protection structure 200 which comprises a polysilicon or metal fuse 202 between metal layer 12 and a p-substrate 204. This protection structure is simple and very easy to manufacture. For example, a polysilicon fuse (1×w×d=5 µm×1 µm×0.20 µm) can easily be blown out at a current of 50 MA and a voltage of 1.5 V.

For the metal fuse 202, the fuse fabrication process is further simplified and can be combined together with the device metal etch process. Also if the metal width can be optimized so that it will be broken by the end of the etch process, it becomes a self-fusing type of fuse device.

Figure 7:
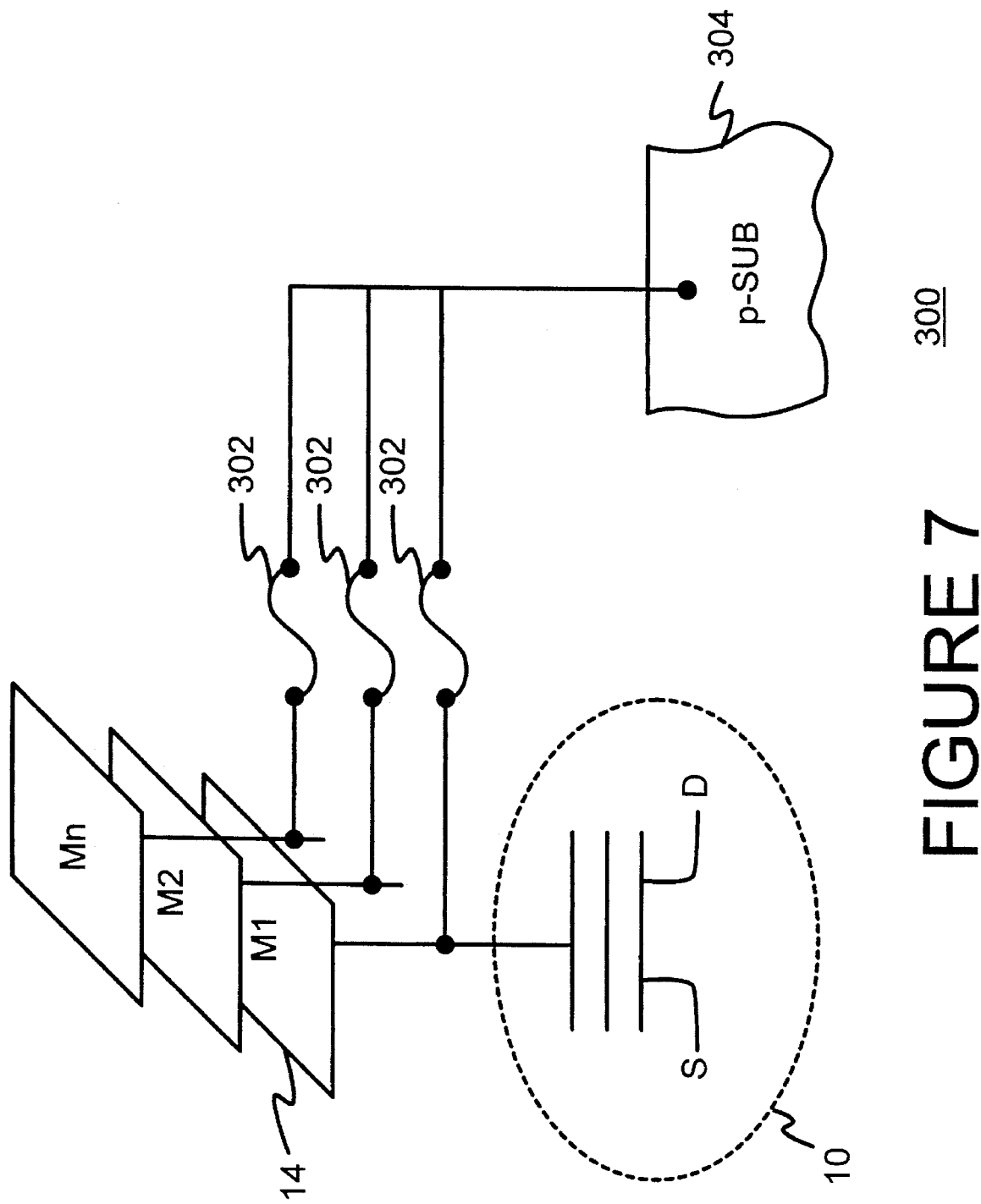
FIG. 7 is a second protection structure for preventing process induced damage in accordance with the present invention.

FIG. 7 shows a second protection structure 300 which includes multiple fuses 302 coupled to a P-substrate 304.

Figure 8:
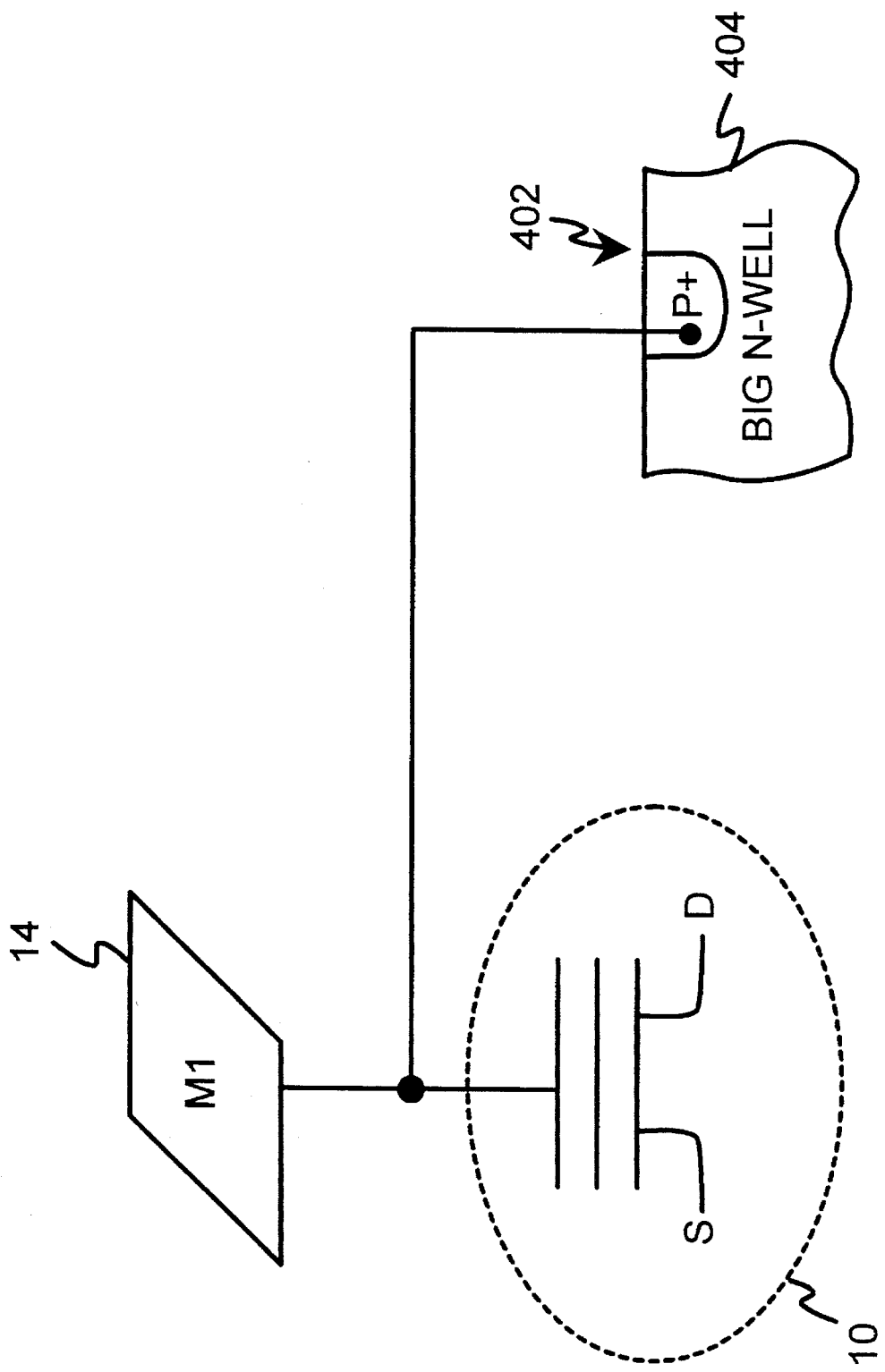
FIG. 8 is a third protection structure for preventing process induced damage in accordance with the present invention.

FIG. 8 shows a third protection structure 400 which comprises $P^+$ diode 404 connecting to the gate of the NVM 10. In this case, some leakage current may pass through the $P^+$ diode 404 when the voltage on the control gate is positive. The N-well 406 coupled to the $P^+$ diode 404 can be made large enough to drain all the generated charge.

Figure 9:
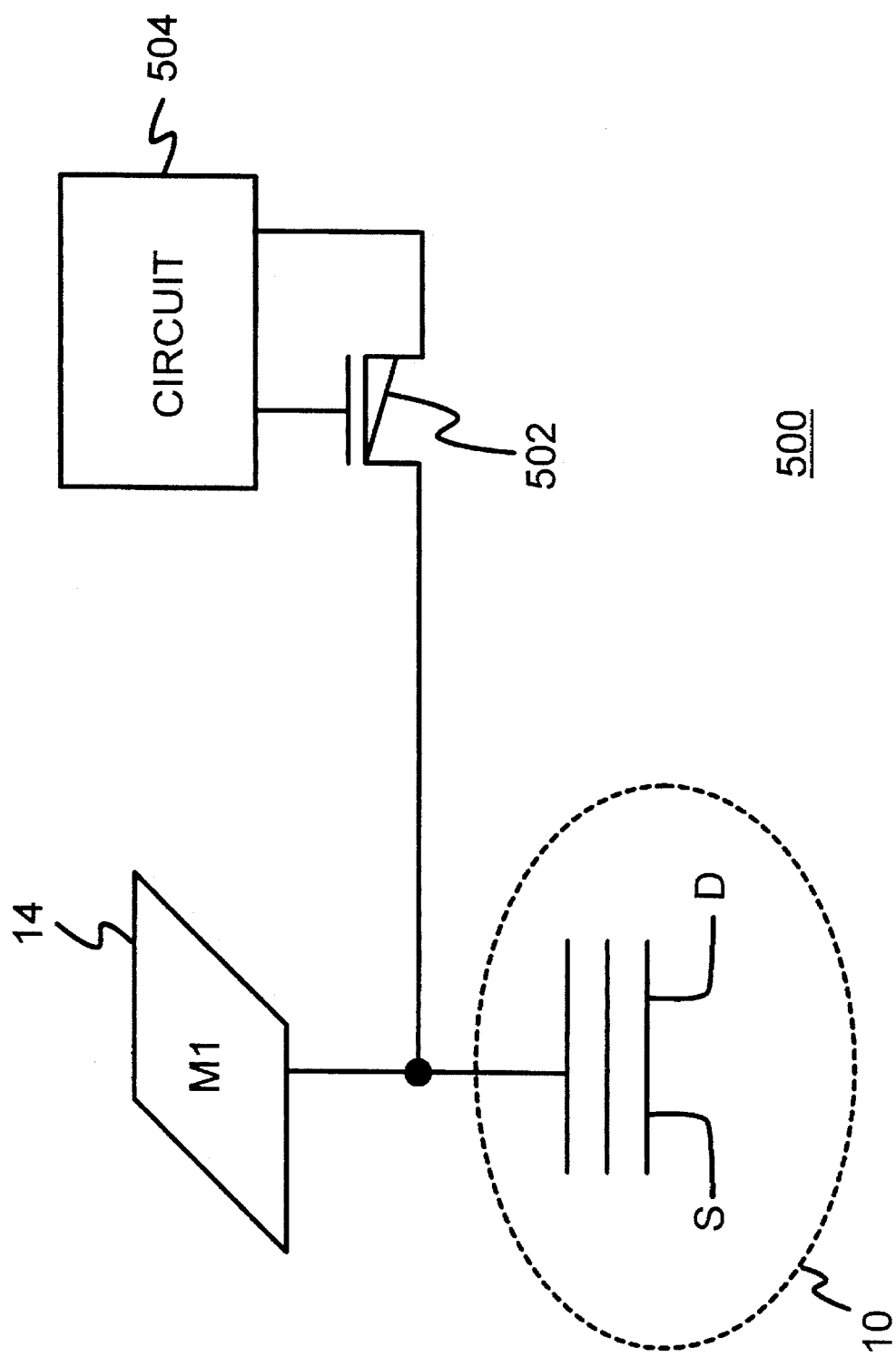
FIG. 9 is a fourth protection structure for preventing process induced damage in accordance with the present invention.

FIG. 9 shows a fourth protection structure 500 which comprises a PMOSFET transistor 504 connecting to the gate of the NVM 10. In this case, some leakage current may pass through the transistor 502 when the voltage on the control gate is positive. The N-well coupled to the transistor 502 can be made large enough to drain all the generated charge. This protection structure 500 can be used in any type of circuit if a PMOSFET as a buffer transistor is allowed.

Figure 10:
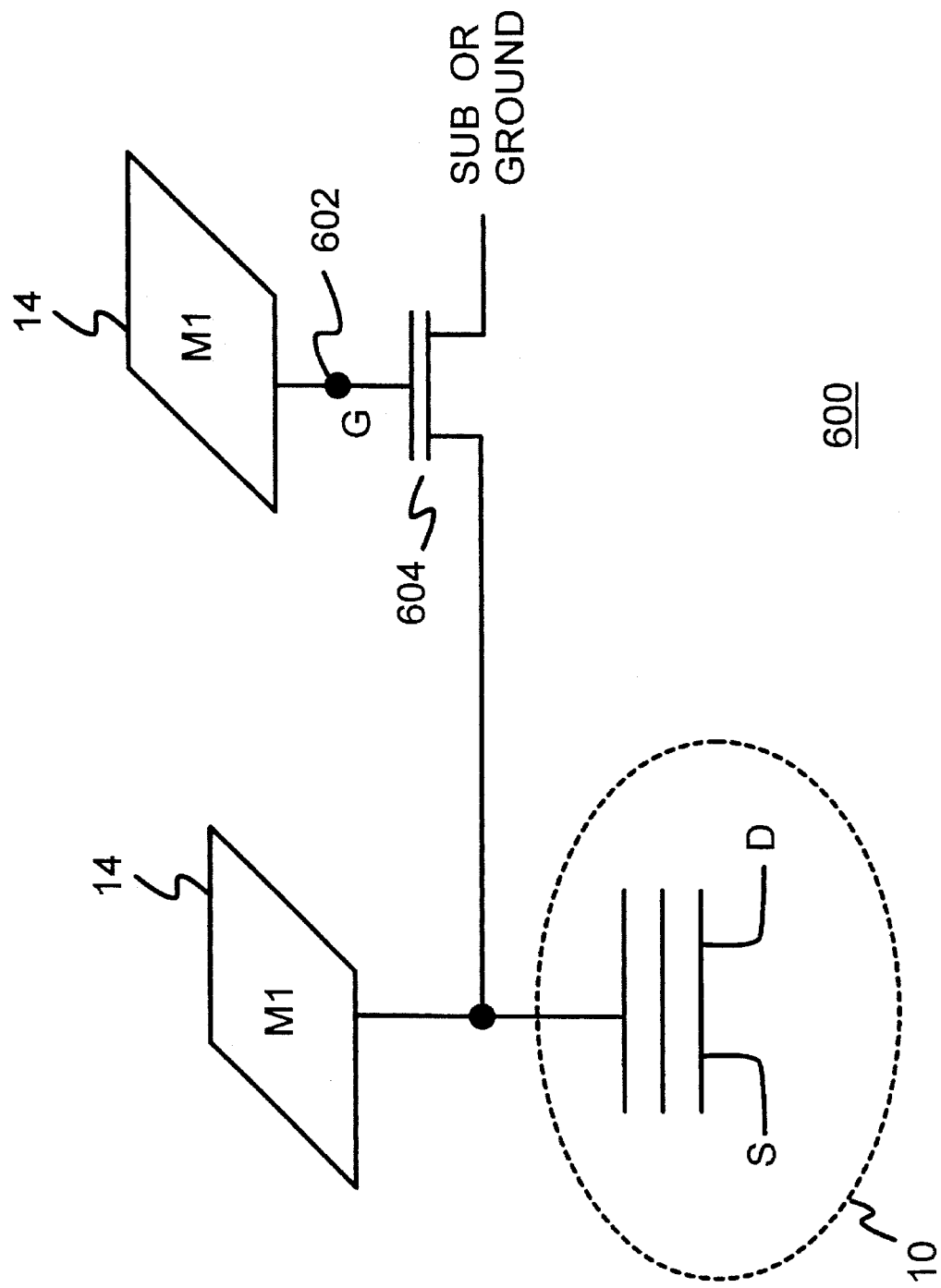
FIG. 10 is a fifth protection structure for preventing process induced damage in accordance with the present invention.

FIG. 10 shows a fifth protection structure 600 which comprises the control gate (or metal) of the NVM 10 coupled to a self-turn-on transistor 604. During plasma etch, the gate voltage of the NMOS device increases due to plasma-induced voltage and then turn-on the transistor to discharge the charges on the control gate 602 automatically.

Figure 11:
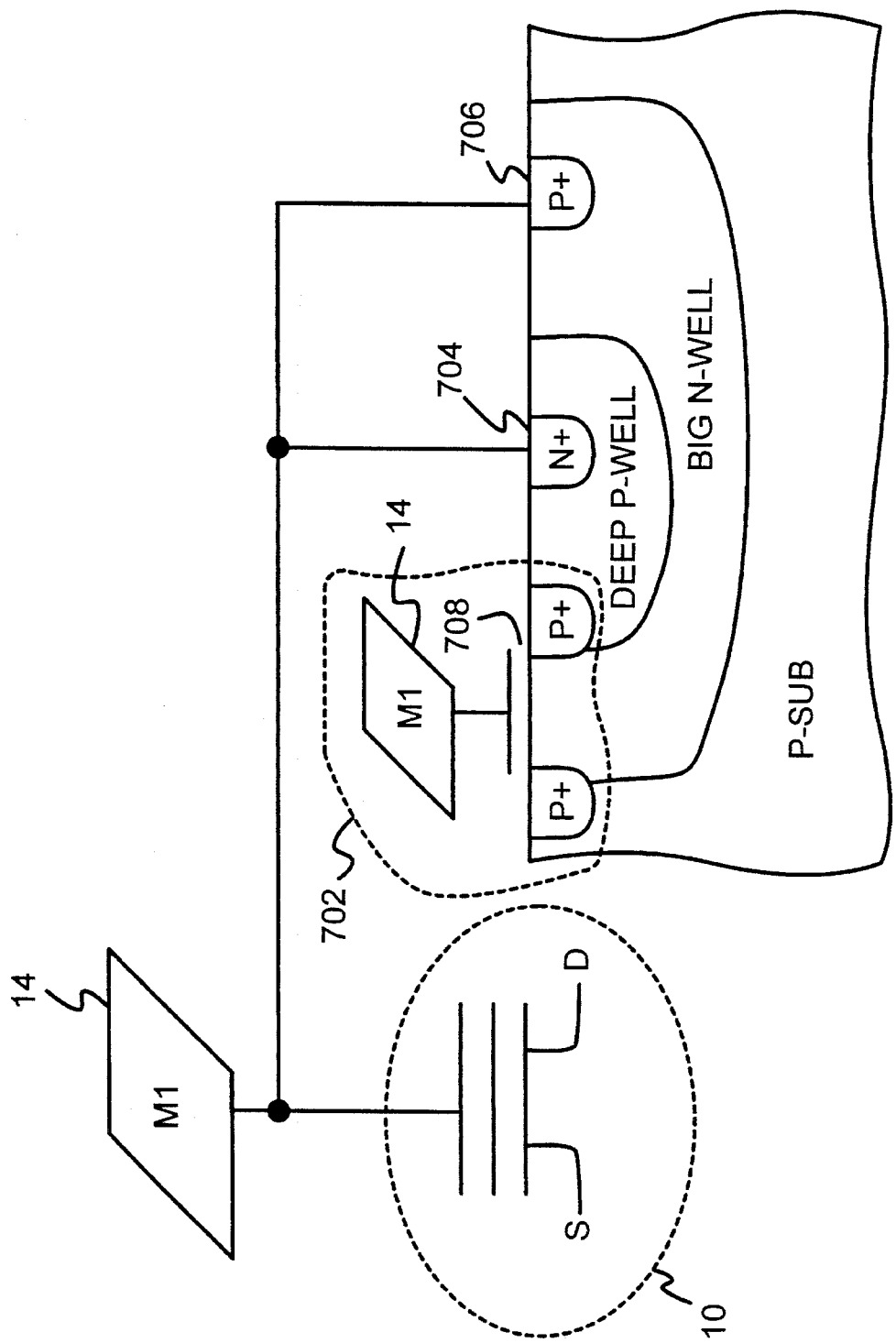
FIG. 11 is a sixth protection structure for preventing process induced damage in accordance with the present invention.

FIG. 11 shows a sixth protection structure 700 which comprises the control gate for the NVM 10 coupled to both $N^+$ and $P^+$ diodes 704 and 706 which include a deep P-well 708 and large N-well 710, respectively (a self-turn on NMOS 712 can be added if P-well cannot drain negative charge efficiently into big N-well). Now, both positive and negative induced charges can be discharged into large N-well 708 and deep P-well 710. The advantage of this structure is that both leakage paths can be blocked by biasing deep P-well and N-well properly.

Another protection structure that could be utilized with the NVM 10 is a combination of the structures of FIGS. 8–10. In addition, another protection structure could comprise any of the protection structures coupled to different layers (such as poly-1, poly-2; M1, M2, etc) of non-volatile memories to fully protect the NVM during the entire fabrication process.

Measuring the $V_{ts}$ of NVMs utilizing the above-identified protection structures coupled to each of the critical layers can provide useful information for etch process optimization, manufacturing and diagnostic tests to improve reliability and yield.

A NVM device 10 which includes a protection structure in accordance with the present invention has several advantages over known NVM devices. Firstly, a NVM device 10 with a protection structure in accordance with the present invention will limit $V_{ts}$ instability through the elimination of in-line process induced damage. As a consequence product reliability will be greatly enhanced. $V_{ts}$ sensing and verifying circuitry will therefore be simplified which will in turn significantly reduce product cost. There will also be a significantly less product testing and analysis time required. Also, the $G_m$ improvement by eliminating the plasma-damage can significantly improve product reliability and performance. Manufacturing constraints will be eased and product fabrication flexibility will be greatly improved. By utilizing a protection structure in accordance with the present invention key etching problems can be identified and etch processes can then be optimized. As a result the process control and product yield for a NVM can be significantly enhanced.

Although the present invention has been described in accordance with the embodiments shown in the figures, one of ordinary skill in the art recognizes there could be variations to the embodiments and those variations would be within the spirit and scope of the present invention. Accordingly, many modifications may be made by one of ordinary skills in the art without departing from the spirit and scope of present invention, the scope of which is defined solely by the appended claims.

We claim:

1. A non-volatile memory (NVM) which provides for improved reliability comprising:

at least one metal layer;

a first polysilicon,p, layer coupled to the at least one metal layer;

a dielectric layer coupled to the first p layer;

a second p layer coupled to the dielectric layer;

a tunnel oxide region coupled to the second p layer;

a source region coupled to the tunnel oxide region;

a drain region coupled to the tunnel oxide region;

protection means coupled at one end to the at least one metal layer and to the first p layer for preventing process induced damage to the dielectric layer and the tunnel oxide region.

2. The NVM of claim 1 which includes multiple metal layers.

3. The NVM of claim 1 in which the first p-layer comprises a thickness of between 1500 Å–5000 Å.

4. The NVM of claim 1 in which the dielectric layer comprises a thickness of between 80 Å to 500 Å.

5. The NVM of claim 1 in which the second p-layer comprises a thickness of between 1000 Å–3000 Å.

6. The NVM of claim 1 in which the tunnel oxide region comprises a thickness of less than 150 Å.

7. The NVM of claim 1 in which the dielectric layer comprises an oxide/nitride/oxide (ONO) layer.

8. The NVM of claim 1 in which the protection means comprises a polysilicon fuse coupled between the at least one metal layer and a p-substrate region.

9. The NVM of claim 8 in which the polysilicon fuse is self fusing.

10. The NVM of claim 1 in which the protection means comprises a plurality of polysilicon fuses coupled between each metal layer and a p-substrate.

11. The NVM of claim 1 in which the protection means comprises a metal fuse coupled between each metal layer and a p-substrate region.

12. The NVM of claim 1 in which the protection means comprises a plurality of metal fuses coupled between the at least one metal layer and a p-substrate.

13. The NVM claim 11 in which the metal fuse is self fusing.

14. The NVM of claim 1 in which the protection means comprises a diode coupled to the at least one metal layer.

15. The NVM of claim 1 in which the protection means comprises a transistor coupled to the metal layer.

16. The NVM of claim 15 in which the transistor comprises a PMOSFET buffer transistor in a big N-well connected to the at least one metal layer.

17. The NVM of claim 1 in which the protection means comprises a self-turn-on transistor coupled between the at least one metal layer and a p-substrate.

18. The NVM of claim 1 in which the protection means comprises:

a first diode coupled to the at least one metal layer;

a P well coupled to the first diode;

a second diode coupled to the at least one metal layer; and a N well coupled to the second diode.

19. The NVM of claim 18 in which the first diode comprises an N diode and the second diode comprises a P diode.

20. The NVM of claim 19 in which the P well comprises a deep P well and the N well comprises a large N well.

21. The NVM of claim 1 in which the protection means comprises a self turn on NMOS transistor between a deep P well and a p-substrate.

22. A non-volatile memory (NVM) which provides for threshold voltage ($V_{ts}$) stability comprising:

a metal layer;

a first polysilicon, p-, layer coupled to the at least one metal layer, the first p-layer comprising a thickness of between 1500 Å–5000 Å;

an oxide/nitride/oxide (ONO) layer coupled to the first p-layer, the ONO layer comprising a thickness of between 80 Å to 500 Å;

a second p-layer coupled to the ONO layer, the second p-layer comprising a thickness of between 1000 Å–3000 Å;

a tunnel oxide region coupled to the second p layer, the tunnel oxide region comprising a thickness of less than 150 Å;

a source region coupled to the tunnel oxide region;

a drain region coupled to the tunnel oxide region;

protection means coupled at one end to the at least one metal layer and the first p-layer for preventing process induced damage to the dielectric layer and the tunnel oxide region.

23. The NVM of claim 22 in which the protection means comprises at least one of:

a polysilicon fuse coupled between the metal layer and a p-substrate region;

a plurality of polysilicon fuses coupled between each of a plurality of metal layers and a p-substrate;

a metal fuse coupled between each of a plurality of metal layers and a p-substrate region;

a plurality of metal fuses coupled between the metal layer and a p-substrate;

a diode coupled to the metal layer and a transistor coupled to the metal layer;

a self-turn-on transistor coupled between the metal layer and a p-substrate; and a first diode coupled to the metal layer; a P well coupled to the first diode; a second diode coupled to the metal layer and a N well coupled to the second transistor.

* * * * *